(12) United States Patent
Ha

(10) Patent No.: US 6,870,769 B1
(45) Date of Patent: Mar. 22, 2005

(54) DECODER CIRCUIT USED IN A FLASH MEMORY DEVICE

(75) Inventor: Im Cheol Ha, Ichon-Shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 08/998,157

(22) Filed: Dec. 24, 1997

(30) Foreign Application Priority Data

Dec. 28, 1996 (KR) ............................................. 96-74959
Dec. 28, 1996 (KR) ............................................. 96-74963

(51) Int. Cl.[7] .......................... G11C 16/04; G11C 16/06

(52) U.S. Cl. ............................ 365/185.13; 365/185.17; 365/185.23; 365/185.33

(58) Field of Search ...................... 365/185.13, 185.17, 365/185.23, 185.33, 185.29, 230.06

(56) References Cited

U.S. PATENT DOCUMENTS

| | | | | |
|---|---|---|---|---|
| 5,193,074 A | * | 3/1993 | Anami ................... | 365/230.06 |
| 5,546,352 A | * | 8/1996 | Sato et al. ............. | 365/230.06 |
| 5,621,690 A | | 4/1997 | Jungroth et al. ........ | 365/185.13 |
| 5,717,636 A | * | 2/1998 | Dallabora et al. ..... | 365/185.13 |

* cited by examiner

Primary Examiner—Trong Phan
(74) Attorney, Agent, or Firm—Piper Rudnick LLP

(57) ABSTRACT

A decoder circuit according to the present invention comprises a global row decoder consisted of a first decoding means selected according to a row address signal and a second decoding means to which an output signal of the first decoding means and an erasure signal are input and a local row decoder for selecting each global word line signal outputted from the global row decoder. The local row decoder is consisted of a first and second transistors to the word line signal is input, and a third, fourth and fifth transistors outputting a first voltage supply signal and a second voltage supply signal to a sector word line.

7 Claims, 2 Drawing Sheets

DECODER CIRCUIT USED IN A FLASH MEMORY DEVICE

BACKGROUND OF THE INVENTION

1. Field of the Invention

The present invention relates to a row decoder circuit in a flash memory device which can increase the number of a local row decoder, to which an output of a global row decoder is input, as many number of sectors when the sectors are divided in a column direction.

2. Description of the Prior Art

Generally, a flash memory device has both functions of electrical program and erasure. In the flash memory device capable of programming sector-by-sector, it is a general requirement that the write cycle of more than a hundred thousand has to be guaranteed. At this time, the number of stress acted to the gate of unit cell is same as the number of the unit cell connected to a single word line, and the number of stress acted to the drain of unit cell is same as the number of the unit cell connected to a single bit line.

FIG. 1 is a circuit diagram of a conventional row decoder.

In a read mode, a first voltage supply signal SnVppx of a selected sector is switched to a Vdd voltage level and a second voltage supply signals SnVeex and XRST thereof are switched to a ground voltage level. At this time, as a PMOS transistor hp1 is turned on, a node A has a Vdd voltage level and the Vdd voltage level of the node A turns on a NMOS transistor thn, thus a sector word line signal SnWL maintains a ground voltage level.

On the other hand, one XNCOM selected by a NAND gate I to which row address signals XBPRED and XCPRED and a sector signal S are input maintains a ground voltage level. At this time, since only a single XAPRED maintains a Vdd voltage level, a NMOS transistor hn of the row decoder which will be selected is turned on, the node A of the selected row decoder maintains a ground voltage level. Therefore, the ground voltage level applied to the node A causes a PMOS transistor hp3 to turn on, thus a sector word line signal SnWL maintains a Vpp voltage level.

In a program mode, the first voltage supply signal SnVppx of the selected sector is switched to a Vpp voltage level, the second voltage supply signal SnVeex thereof is switched to a ground voltage level. The XRST thereof maintains a ground voltage level before the first voltage supply signal SnVppx is switched to Vpp voltage and is switched to Vpp voltage level when the first voltage supply signal SnVppx is switched to Vpp voltage. A first voltage supply signal SnVppx of a non-selected sector maintains a Vdd voltage level and the XRST of the non-selected sector maintains a ground voltage level so that a word line SnWL of the not-selected sector is switched to a ground voltage level.

On the other hand, one XnCOM selected by a NAND gate I to which row address signals XBPRED and XCPRED and the sector signal S are input maintains a ground voltage level. At this time, since only a single XAPRED maintains a Vdd voltage level, a NMOS transistor hn of the row decoder which will be selected is turned on, the node A of the selected row decoder maintains a ground voltage level. Therefore, the ground voltage level applied to the node A causes a PMOS transistor hp3 to turn on, thus a sector word line signal SnWL maintains a Vpp voltage level.

In an erase mode, the first voltage supply signal SnVppx of the selected sector is switched to a ground voltage level, the second voltage supply signal SnVeex thereof is switched to a −Vpp voltage level, and XRST thereof is switched to a ground voltage level. And, a first voltage supply signal SnVppx of a non-selected sector is switched to a Vdd voltage level, a second voltage supply signal SnVeex thereof is switched to a ground voltage level, and the XRST thereof is switched to a ground voltage level.

As a result, as the node A of the non-selected sector is at Vdd voltage level, the sector word line thereof maintains a ground voltage level. Meanwhile, as the NMOS transistor thn in the row decoder of the selected sector is turned on, all the word line signals SnWL maintain a −Vpp voltage level.

In the row decoder as described above, the number of the row decoder is increased as many when the sector is divided in a column direction, the number of XnCOM of the row decoder is increased. Therefore, a free decoder output load and an address buffer output load are increased proportionally. As a result, an access time is delayed and the size of a chip becomes large.

SUMMARY OF THE INVENTION

It is, therefore, an object of the present invention to provide a row decoder circuit which can minimize a load due to a row address signal and decrease an access time and a size of chip due to the local row decoder having a simply circuit.

A decoder circuit according to the present invention comprises a global row decoder consisted of a first decoding means selected according to a row address signal and a second decoding means to which an output signal of the first decoding means and an erasure signal are input and a local row decoder for selecting each global word line signal outputted from the global row decoder.

The local row decoder is consisted of a first and second transistors to the word line signal is input, and a third, fourth and fifth transistors outputting a first voltage supply signal and a second voltage supply signal to a sector word line.

Another decoder circuit of the present invention comprises a global row decoder for outputting a global word line signal and a local row decoder for selecting a word line in response to the global word line signal of the global row decoder. The global row decoder is consisted of a first and second transistors to which XnCOM signal is input and a third and fourth transistors, to which an output voltage of the first and second transistors, for outputting a Vppx or Veex to a global sector word line.

BRIEF DESCRIPTION OF THE DRAWINGS

Other objects and advantages of the present invention will be understood by reading the detailed explanation of the embodiment with reference to the accompanying drawings in which.

DETAILED DESCRIPTION OF THE DRAWINGS

Below, the preferred embodiments of the present invention will be in detail explained by reference to the accompanying drawings.

Figure 1:
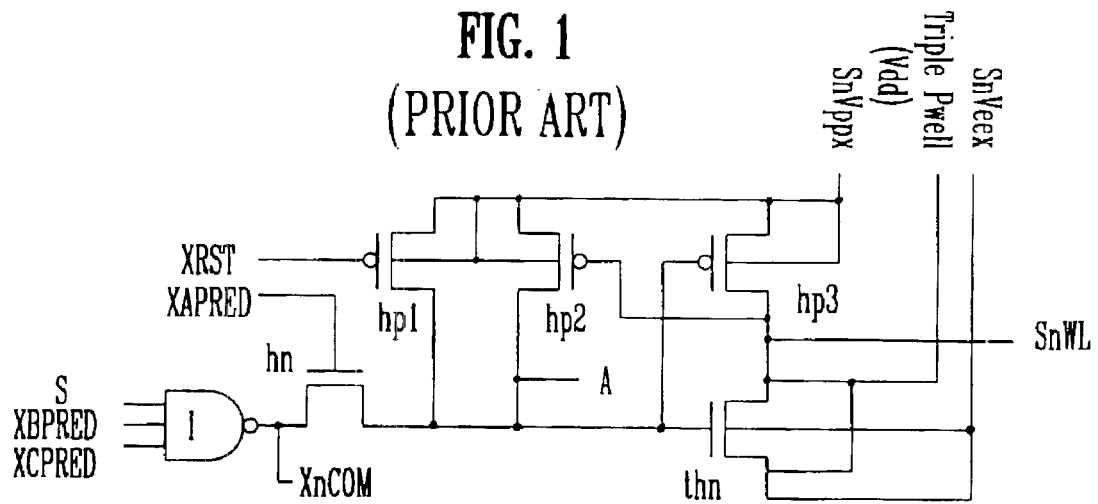
FIG. 1 is a circuit diagram illustrating a conventional row decoder.
Figure 2:
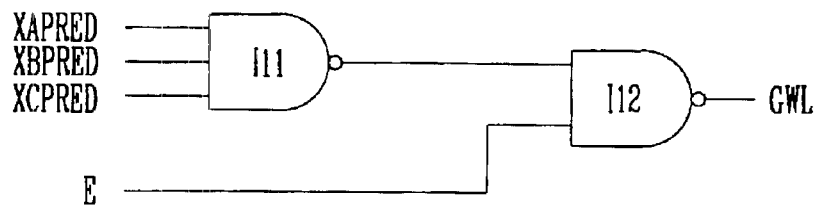
FIG. 2 is a circuit diagram illustrating a global row decoder according to the first embodiment of the present invention.

FIG. 2 is a circuit diagram illustrating a global row decoder according to the first embodiment of the present invention.

An output signal of a first decoding means I11 is determined by row address signals XAPRED, XBPRED and XCPRED. The output signal of the first decoding means I11 and an erasure signal E are input to a second decoding means I12, thereby outputting a global word line signal GWL. The first and second decoding means I11 and I12 are consisted of NAND gates. That is, in a read node and a program mode, only one of a plurality of global word line signals GWL is selected as a Vdd voltage level. In erasure mode, since the erasure signal E maintains a ground voltage level, the global word line signal GWL in all the global row decoder maintains a Vdd voltage level.

Figure 3:
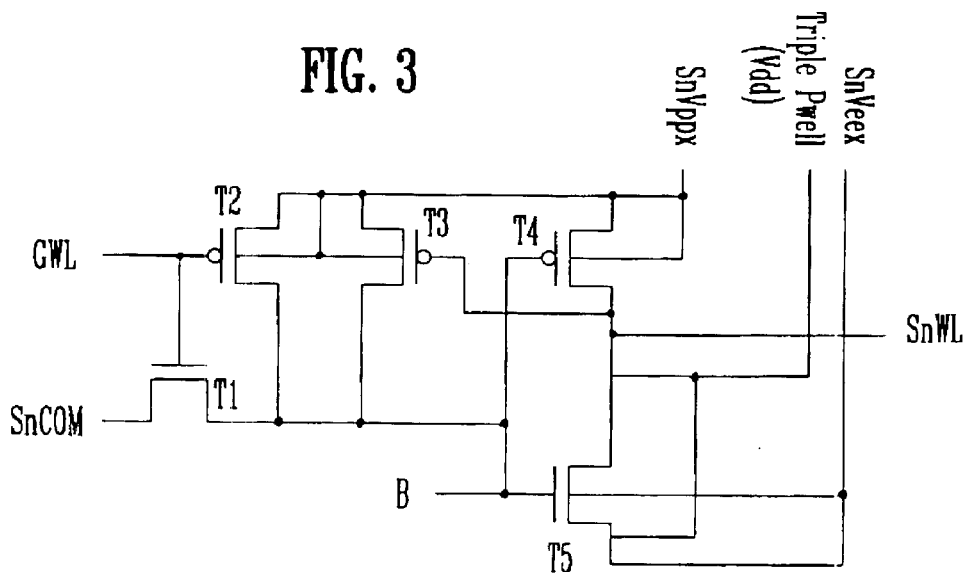
FIG. 3 is a circuit diagram illustrating a local row decoder according to the first embodiment of the present invention.

FIG. 3 is a circuit diagram of a local row decoder. The global word line signal GWL is input to the local low decoder, the global word line signal GWL transfers to a sector word line of the column sector selected by means of the combination of the column sector address SnCOM. Also, a sector word line signal SnWL of a non-selected column sectors maintains a ground voltage level.

The operations of the local row decoder will be explained mode-by-mode as follows.

In a read mode, a first voltage supply signal SnVppx of all the column sectors is switched to a Vdd voltage level and a second voltage supply signal SnVeex thereof is switched to a ground voltage level. The selected column sector address signal SnCOM of the column sector is switched to a ground voltage level and the non-selected column sector address signal SnCOM of the column sector is switched to a Vdd voltage level. As a result, as a second transistor T2 of the local row decoder is turned on by the non-selected global word line signal GWL, a voltage of the node B maintains a Vdd voltage level, and the voltage of the node B turns on a fifth transistor T5, thus the sector word line signal SnWL maintains a ground voltage level.

On the other hand, the selected global word line signal GWL becomes a Vdd voltage level so that the first transistor T1 is turned on, thus a voltage of the node B becomes a voltage of the column sector address signal SnCOM by means of the column sector. Therefore, since the column sector address signal SnCOM of the non-selected column sectors is at Vdd voltage level, the fifth transistor T5 is turned on. Thus, the sector word line signal SnWL becomes a ground voltage level. Since the only column sector address signal SnCOM of the selected column sectors becomes a ground voltage level, the fourth transistor T4 is turned on and the sector word line signal SnWL has a Vdd voltage level. As a result, only one selected sector word line signal SnWL of all the sector word lines SnWL has a Vdd voltage level, and the other sector word line signals SnWL maintain a ground voltage level.

Next, in a program mode, the first voltage supply signal SnVppx of a selected sector is switched to a Vpp voltage level, the first voltage supply signal SnVppx of non-selected sectors is switched to a Vdd voltage level, and all second voltage supply signals SnVeex are switched to a ground voltage level. Also, the column sector address signal SnCOM of the selected column sector is switched to a ground voltage level and the non-selected column sector address signal SnCOM is switched to a Vdd voltage level. Therefore, the non-selected global word line signal GWL turns on the second transistor T2 so at to a switching a voltage of the node B to a Vdd voltage level and the Vdd voltage level applied to the node B turns on the fifth transistor T5. Therefore, a corresponding sector word line signal SnWL maintains a ground voltage level.

Meanwhile, the selected global word line signal GWL turns on the first transistor T1, therefore, the node B maintains a voltage of a column sector address signal SnCOM by means of a column sector. At this time, the third and the fifth transistors T3 and T5 in the non-selected column sector are turned on, therefore, the sector word line signal SnWL maintains a ground voltage level. And, the fourth transistor T4 in the selected column sector is turned on, therefore, the sector word line signal SnWL maintains a Vpp voltage level.

As a result, only one selected sector word line signal SnWL of all the sector word lines signal SnWL has a Vpp voltage level, and the other sector word line signals SnWL maintains a ground voltage level.

In an erasure mode, the first voltage supply signal SnVppx of a selected sector is switched to a ground voltage level and the second voltage supply signal SnVeex is switched to a −Vpp voltage level. And, the first voltage supply signals SnVppx of non-selected sectors are switched to a Vdd voltage level and the second voltage supply signals SnVeex of the non-selected sectors are switched to a ground voltage level. Since a voltage of the global word line signal GWL which is an output signal of the global low decoder is at Vdd voltage level, the first transistor T1 is turned on by means of the global word line signal GWL, thus the node B maintains a voltage of a column sector address signal SnCOM by means of the column sector. At this time, as the first voltage supply signal SnVppx and the column sector address signal SnCOM of the non-selected sectors maintain Vdd voltage level, the node B maintains a Vdd voltage level and the fifth transistor T5 is turned on. As a result, the sector word line signal SnWL of the non-selected sectors maintain a ground voltage level.

On the other hand, since the first voltage supply signal SnVppx of a selected sector maintains a ground voltage level, the second voltage supply signal SnVeex is at Vpp voltage level and the column sector address signal SnCOM maintain a ground voltage level, the fifth transistor T5 of all the local row decoders of the selected sector is turned on and all the sector word line signals SnWL of the selected sector maintain a −Vpp voltage level.

Figure 4:
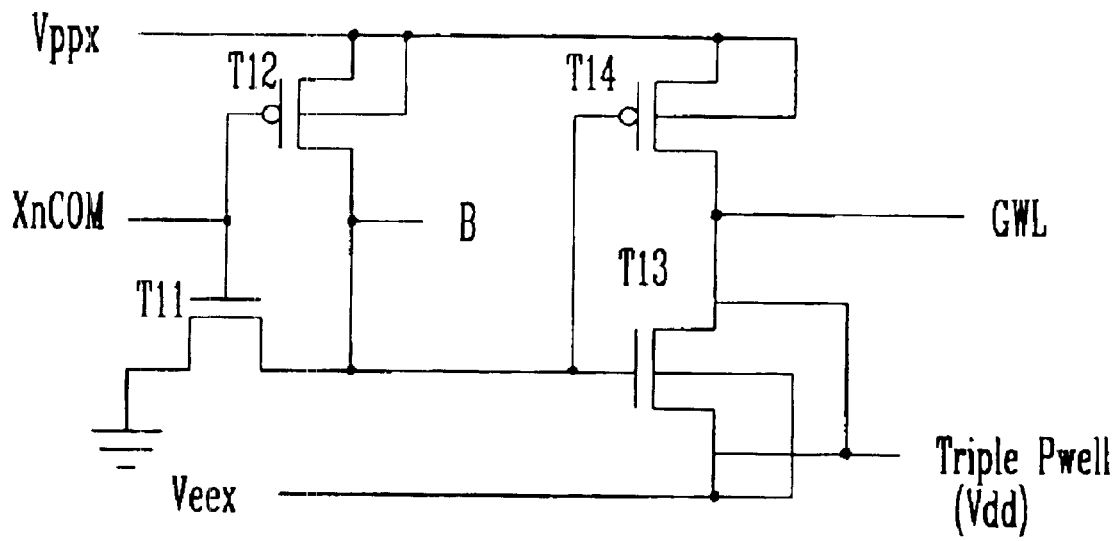
FIG. 4 is a circuit diagram illustrating a global row decoder according to the second embodiment of the present invention.

FIG. 4 is a circuit diagram illustrating a global row decoder according to the second embodiment of the present invention. XNCOM of a global row decoder selected by a row address signal maintains a Vdd voltage level.

Explanation for the operations will be given mode-by-mode as follow.

In a read mode, Vppx is switched to a Vdd voltage level and Veex is switched to a ground voltage level. At this time, as XnCOM of a selected global row decoder is at Vdd voltage level, a second transistor T12 is turned off and a first transistor T11 is turned on. Therefore, the node B maintains a ground voltage level so that the fourth transistor T14 is turned on and the global word line signal GWL maintains a Vdd voltage level.

Meanwhile, as XnCOM of a non-selected global row decoder maintains a ground voltage level, the second transistor T12 is turned on, thus the node B maintains a Vdd voltage level. Therefore, a third transistor T13 is turned on so that non-selected global word line signal GWL maintains a ground voltage level.

In a program mode, Vppx of the global row decoder is switched to a Vpp voltage level by means of a selected row sector address, and Vppx of non-selected global row decoders is switched to a Vdd voltage level. At this time, the first transistor T11 of the selected global row decoder is turned on so that the node B maintains a ground voltage level. As a result the fourth transistor T14 is turned on and thus the selected global word line signal GWL maintain a Vpp voltage level.

Meanwhile, as XnCOM of the non-selected global row decoder maintains a ground voltage level, the second transistor T12 is turned on so that the node 13 maintains a Vpp voltage level. Also, the third transistor T13 is turned on so that the non-selected global word line signal GWL maintains a ground voltage level.

Finally, in an erasure mode, Vppx of the global row decoder selected by a row sector address is switched to a ground voltage level and Vppx of the non-selected global row decoders is switched to a Vdd voltage level. And, Veex of the selected global row decoder is switched to a −Vpp voltage level and Vppx of the non-selected global row decoders is switched to a ground voltage level. Also, as XNCOM of the global row decoder maintains a Vdd voltage level by an erase signal in the erasure mode and Veex of the row sector selected by the row sector address is at −Vpp voltage level, the first and the third transistors T11 and T13 in the global row decoder of the selected row sector are turned on and thus the all global word line signal GWL maintain a −Vpp voltage level.

Meanwhile, Veex of the non-selected global row decoder maintains a ground voltage level and Vppx thereof maintains a Vdd voltage level so that the second and the third transistors T12 and T13 are turned on, thus the global word line signal GWL maintains a ground voltage level.

Figure 5:
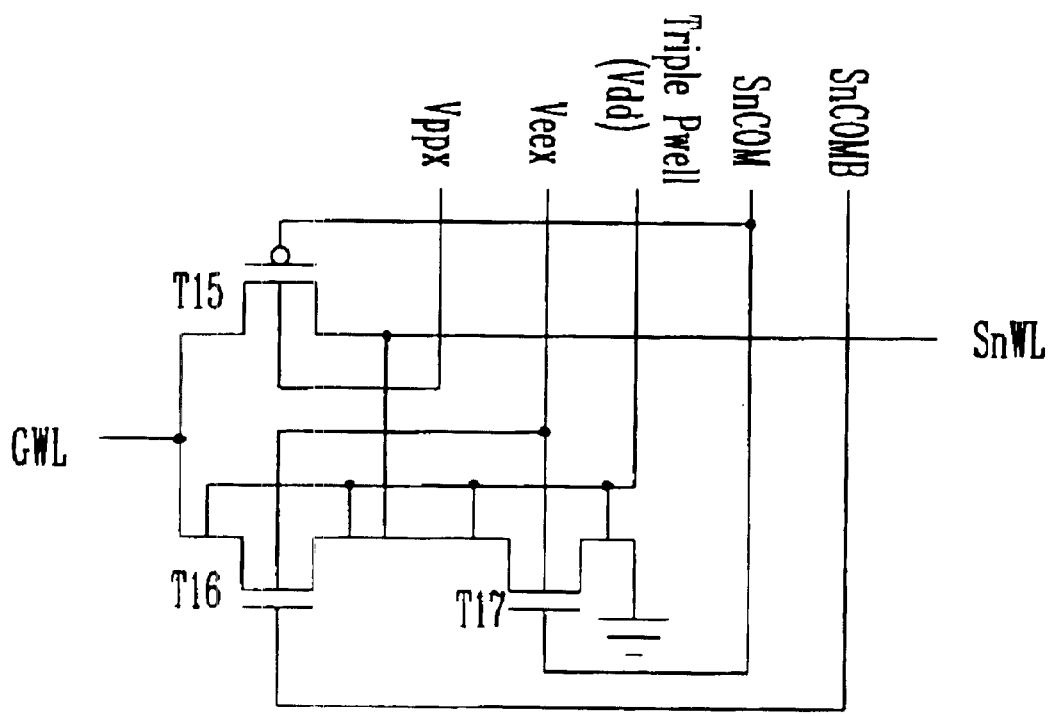
FIG. 5 is a circuit diagram illustrating a local row decoder according to a the second embodiment of the present invention.

FIG. 5 is a circuit diagram of a local row decoder. In the local decoder to which the global word line signal GWL is input, the voltage level of the global word line signal GWL is transferred to the only column sector selected by a combination of the first and the second column sector address signals SnCOM and SnCOMB, and the word line signal GWL of the non-selected column sectors maintains a ground voltage level.

Vppx and Veex of the local row decoder and Vppx and Veex of the global row decoder are switched according to the each mode. And, although the fifth transistor T15 and the sixth transistor T16 in the local row decoder of a column sector selected by a combination of a gate input of the local row decoder (the first and the second column sector address signals SnCOM and SnCOMB), Vppx and Veex are turned on, the fifth transistor T15 and the sixth transistor T16 in the local row decoder of non-selected column sector are turned off and the seventh transistor T17 is turned on so that the word line signal SnWL maintains a ground voltage level.

Explanation of the operation will be described mode-by-mode.

In a read mode, Vppx maintains a Vdd voltage level and Veex maintains a ground voltage level. A selected global word line GWL maintains a Vdd voltage level and a non-selected global word line signal GWL maintains a ground voltage level. At this time, as a first column sector address SnCOM is switched to a ground voltage level and a second column sector address SnCOMB is switched to a Vdd voltage level, the fifth and the sixth transistors T15 and T16 of a selected column sector are turned on, and the seventh transistor T17 is turned off, so that the word line signal SnWL maintains a Vdd voltage level of the global word line signal GWL.

Meanwhile, as the first column sector address signal SnCOM is switched to a Vdd voltage level and the second column sector address signal SnCOMB is switched to a Vdd voltage level, the fifth and the sixth transistor T15 and T16 of a non-selected column are turned off and the seventh transistor T17 is turned on so that the word line signals SnWL maintain a ground voltage level.

In a program mode, a selected global word line signal GWL maintains a Vpp voltage level and Vppx maintains a Vpp voltage level. And, a selected global word line signal GWL maintains a ground voltage level, Vppx maintains a Vdd voltage level, and Veex maintain a ground voltage level. As the first column sector address signal SnCOM maintains a Vdd voltage level and the second column sector address signal SnCOMB maintains a ground voltage level, the fifth and the sixth transistor T15 and T16 of the local row decoder in non-selected row sector are turned off and the seventh transistor T17 is turned on so that the word line signal SnWL maintains a ground voltage level.

On the other hand, if the first column sector address signal SnCOM maintains a ground voltage level and the second column sector address signal SnCOMB maintains a Vdd voltage level, the fifth and the sixth transistor T15 and T16 of the local row decoder are turned on and the seventh transistor T17 is turned off so that the global word line signal GWL maintains a voltage level of the global the word line signal SnWL. As a result, only single word line signal SnWL maintains a Vpp voltage level and the other the word line signals SnWL maintain a ground voltage level.

In an erase mode, the global word line signal GWL selected by a row sector address maintains a −Vpp voltage level, Vppx maintains a ground voltage level and Veex maintains a −Vpp voltage level. And, a non-selected global word line signal GWL maintains a Vdd voltage level, Vppx maintains a Vdd voltage level, and Veex maintains a ground voltage level. Since the first column sector address signal SnCOM of the non-selected row sector maintains a Vdd voltage level and the second column sector address signal SnCOMB maintains a ground voltage level, the fifth and the sixth transistor T15 and T16 are turned off and the seventh transistor T17 is turned on so that the word line signal SnWL of all the local row decoders maintain a ground voltage level.

The first column sector address signal SnCOM of a selected column sectors among the selected row sectors maintains a −Vpp voltage level and the second column sector address signal SnCOMB maintains a ground voltage level. And, the first column sector address signal SnCOM of the non-selected column sectors maintains a ground voltage level and the second column sector address signal SnCOMB maintains a −Vpp voltage level.

As a result, even though the global word line signal GWL maintains a −Vpp voltage level by means of the row sector address, the fifth and the sixth transistors T15 and T16 of the local row decoders of the selected column sector are turned on and the seventh transistor T17 is turned off so that the word line signal SnWL maintains a voltage level of the global word line GWL. Also, the fifth and the sixth transistors T15 and T16 of the local row decoders of the non-selected column sector are turned off and the seventh transistor T17 is turned on so that the word line signal SnWL of the local row decoders of the non-selected column sector maintains a ground voltage level.

In the present invention as described above, a load due to a row address signal can be minimized by increasing a local row decoder to which an output of a global row decoder is input as many as a number of sector when the sector is divided in column direction, therefore, it is possible to decrease an access time and decrease a size of chip due to the local row decoder having a simply circuit. Also, it is possible to decrease a load to pumping voltage (Vpp and −Vpp)

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A decoder circuit used in a flash memory device comprising:
   a global row decoder for outputting a global word line signal, said global row decoder consisted of a first decoding means selected according to a row address signal and a second decoding means to which an output signal of said first decoding means and an erasure signal are input; and
   a local row decoder for selecting a word line by a global word line signal outputted from said global row decoder.

2. The decoder circuit of claim 1, wherein said first and second decoding means are consisted of NAND gates.

3. The decoder circuit of claim 1, wherein said local row decoder is consisted of:
   a first switching element for transferring a column sector address to a node according to said global word line signal;
   a second switching element for transferring a first signal to said node according to said global word line signal;
   a third switching element connected, in parallel, with said second switching element, said third switching element operated by potential of a word line;
   a fourth switching element for transferring said first signal to said word line according to potential of said node; and
   a fifth switching element for transferring a second signal to said word line according to potential of said node.

4. The decoder circuit of claim 3, wherein said second, third and fourth switching elements are consisted of PMOS transistor, respectively, and each of said first and fifth switching elements is consisted of an NMOS transistor.

5. A decoder circuit used in a flash memory device, comprising:
   a global row decoder for outputting a global word line signal, wherein said global row decoder comprises:
   a first transistor for transferring a first voltage to a node according to a first signal;
   a second transistor for transferring a ground voltage to said node according to said first signal;
   a third transistor for transferring a second voltage to a global word line according to potential of said node; and
   a fourth transistor for transferring said first voltage to said global word line according to potential of said node;
   a local row decoder for selecting a word line in response to said global word line signal of said global row decoder, wherein said local row decoder comprises:
   a fifth transistor for transferring said global word line signal to said word line in response to a second signal;
   a sixth transistor for transferring said global word line signal to said word line according to a third signal; and
   a seventh transistor for transferring a ground voltage to said word line in response to said second signal.

6. The decoder circuit of claim 5, wherein said first and third transistors are consisted of PMOS transistor, and each of said second and fifth transistors is consisted of an NMOS transistor.

7. The decoder circuit of claim 6, wherein said fifth transistor is consisted of a PMOS transistor, and each of said sixth and seventh transistors is consisted of an NMOS transistor.

* * * * *